(12) United States Patent
Chang et al.

(10) Patent No.: US 7,388,431 B2
(45) Date of Patent: Jun. 17, 2008

(54) SWITCHING AMPLIFIER AND CONTROL METHOD THEREOF

(75) Inventors: Ming-Hung Chang, Jubei (TW); Fu-Yuan Chen, Alian Township, Kaohsiung County (TW)

(73) Assignee: Analog and Power Electronics Corp., Hsinchu (TW)

( * ) Notice: Subject to any disclaimer, the term of this patent is extended or adjusted under 35 U.S.C. 154(b) by 122 days.

(21) Appl. No.: 11/389,194

(22) Filed: Mar. 27, 2006

(65) Prior Publication Data

US 2006/0284677 A1    Dec. 21, 2006

(30) Foreign Application Priority Data

Jun. 15, 2005  (TW) .............................. 94119889 A

(51) Int. Cl.
*H03F 3/217*   (2006.01)
(52) U.S. Cl. ...................... 330/251; 330/10; 330/207 A
(58) Field of Classification Search .................. 330/10, 330/207 A, 251
See application file for complete search history.

(56) References Cited

U.S. PATENT DOCUMENTS 6,847,257 B2 * 1/2005 Edwards et al. .............. 330/10

* cited by examiner

*Primary Examiner*—Robert Pascal
*Assistant Examiner*—Hieu P Nguyen
(74) *Attorney, Agent, or Firm*—Rosenberg, Klein & Lee

(57) ABSTRACT

In a switching amplifier for generating a pair of output signals of square waves in response to an input signal, when the input signal is zero, the first output signal has a first duty cycle and the second output signal has a second duty cycle; when the input signal is greater than zero, the first output signal has a third duty cycle varying with the input signal and the second output signal still has the second duty cycle; and when the input signal is less than zero, the first output signal has the first duty cycle and the second output signal has a fourth duty cycle varying with the input signal. The first and second duty cycles are very small but equal to each other in size, and the phase difference between the first and second output signals could range from 0 to 180 degrees.

15 Claims, 5 Drawing Sheets

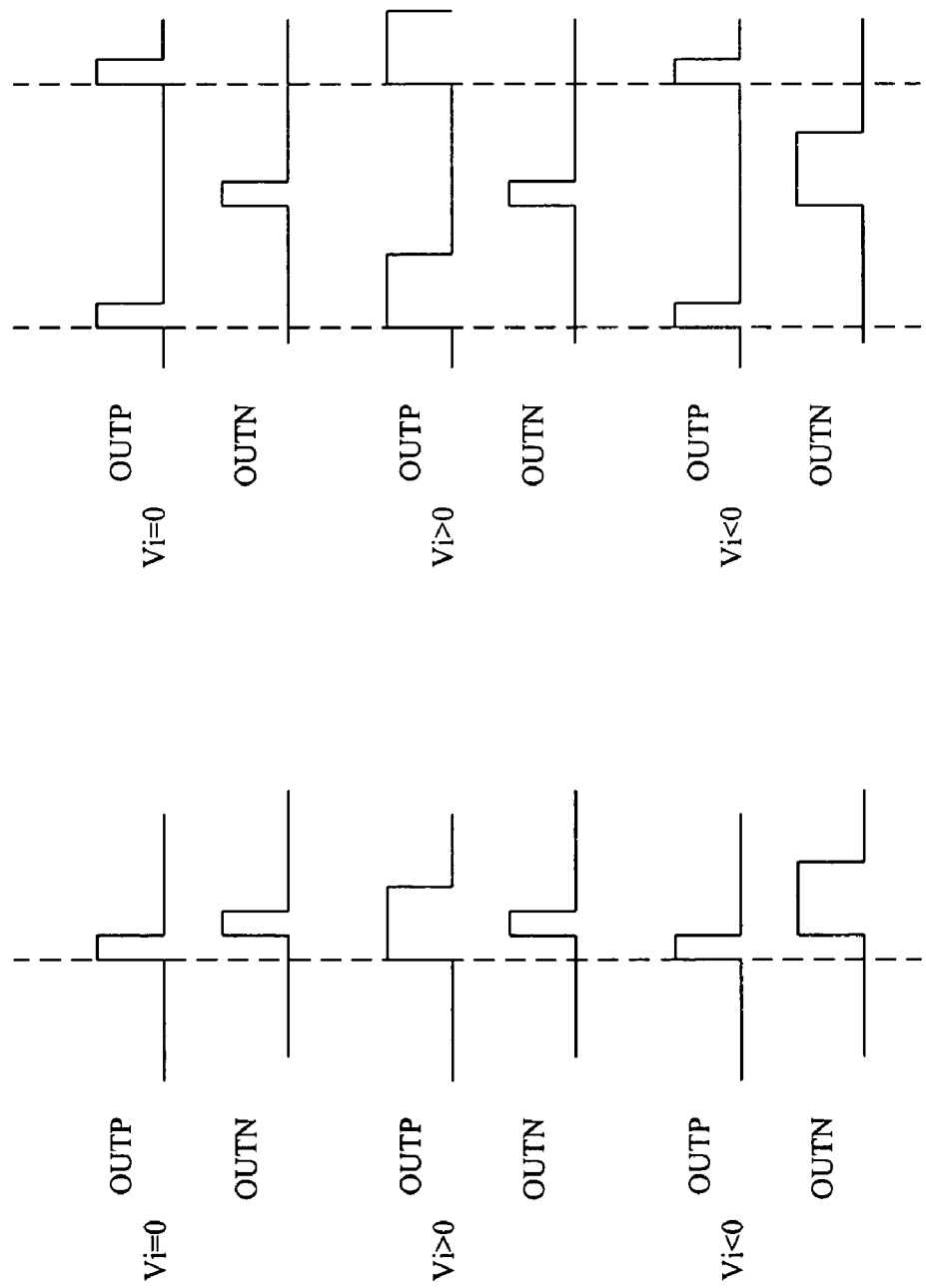

SWITCHING AMPLIFIER AND CONTROL METHOD THEREOF

FIELD OF THE INVENTION

The present invention generally relates to a switching amplifier and, more particularly, to a high efficiency and low electromagnetic interference (EMI) switching amplifier and a control method thereof.

BACKGROUND OF THE INVENTION

Switching amplifiers, also known as Class-D amplifiers, have the advantages in efficiency and benefits because of the efficiency, when compared to the Class-AB amplifiers. As shown in FIG. 1, a conventional switching amplifier 10 with a low-pass filter (LPF) comprises an H-bridge circuit composed of transistors M1, M2, M3 and M4, and a control circuit 12 in response to an input signal Vi to switch the transistors M1, M2, M3 and M4 to thereby generate a pair of output signals OUTP and OUTN. The operation of the conventional switching amplifier 10 makes the output signals OUTP and OUTN in opposite polarities at any input signal and any time, and therefore, when the switching amplifier 10 is connected directly with an inductive load 16 such as a coil type speaker, there will be a large switching current flowing through the load 16, which will induce severe EMI problems and have the load 16 to bear the power dissipation resulted from the induced signals outside of the audio frequency band. It is thus necessary to filter out the signal components outside of the audio frequency band from the output signals OUTP and OUTN by a LPF 14 before they are applied to the load 16. FIG. 2 shows a waveform diagram of the output signals OUTP and OUTN of the switching amplifier 10 at different input signal Vi's, in which waveform 20 represents the output signal OUTP and waveform 22 represents the output signal OUTN. When the input signal Vi=0, the duty cycles of the output signals OUTP and OUTN both are 50%; when the input signal Vi>0, the duty cycle of the output signal OUTP increases and the duty cycle of the output signal OUTN decreases; and when the input signal Vi<0, the duty cycle of the output signal OUTP decreases and the duty cycle of the output signal OUTN increases. In other conventional switching amplifiers, it may also be the case that when the input signal Vi>0, the duty cycle of the output signal OUTP decreases while the duty cycle of the output signal OUTN increases, and when the input signal Vi<0, the duty cycle of the output signal OUTP increases while the duty cycle of the output signal OUTN decreases.

However, introducing the LPF 14 will result in cost raise and efficiency drop for implementing a switching amplifier, and it is therefore provided another type of amplifier, i.e., filterless switching amplifier. Under appropriate switching control, for instance disclosed in U.S. Pat. Nos. 6,211,728 and 6,262,632, a filterless switching amplifier may retain the advantages in efficiency. Additionally, the EMI issue is also important in the design of filterless switching amplifiers. The present invention is directed to a high efficiency and low EMI switching amplifier and a control method thereof.

SUMMARY OF THE INVENTION

An object of the present invention is to provide a switching amplifier and a control method thereof.

According to the present invention, a switching amplifier includes an H-bridge circuit with a pair of output terminals and a control circuit to operate the H-bridge circuit in response to an input signal so as to generate a pair of output signals having square waves thereof on the output terminals, respectively. When the input signal is zero, the first output signal has a first duty cycle, and the second output signal has a second duty cycle. When the input signal is greater than zero, the first output signal has a third duty cycle varying with the input signal and the second output signal still has the second duty cycle. When the input signal is less than zero, the first output signal still has the first duty cycle and the second output signal has a fourth duty cycle varying with the input signal.

Preferably, the first and second duty cycles have equal size, and the width of the square waves is extremely small. The first and second output signals may be in phase, opposite in phase, or with any phase difference therebetween. Since the square waves have extremely small width, even if the first and second output signals are out of phase, there will not be excessive switching current and thus, even without any LPF to filter out the high-frequency current components flowing through the load, it is still avoided severe EMI problems and the cost of implementing the LPF, while maintaining the benefit of the high efficiency inherently in the switching amplifier.

Furthermore, even if LPF is inserted between the output terminals and the load to further suppress the EMI induced from the switching output signals, the switching amplifier still operates normally.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which:

FIG. 5 is a timing diagram of the output signals OUTP and OUTN that have a phase difference between 0 and 180 degrees; and FIG. 6 is a timing diagram of the output signals OUTP and OUTN that have the phase difference of 180 degrees.

DETAIL DESCRIPTION OF THE INVENTION

Figure 3:
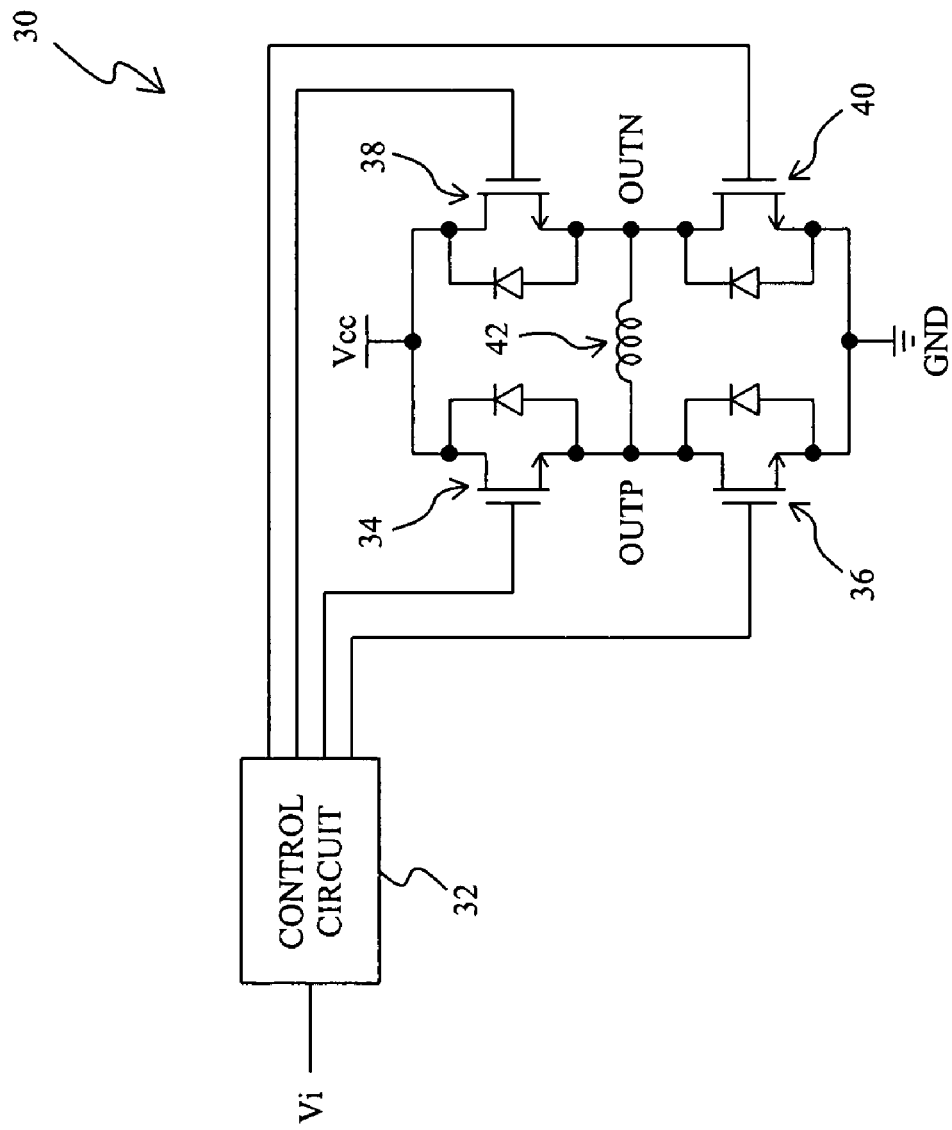
FIG. 3 is a schematic diagram of an embodiment according to the present invention that may have load directly coupled between its output terminals.
Figure 4:
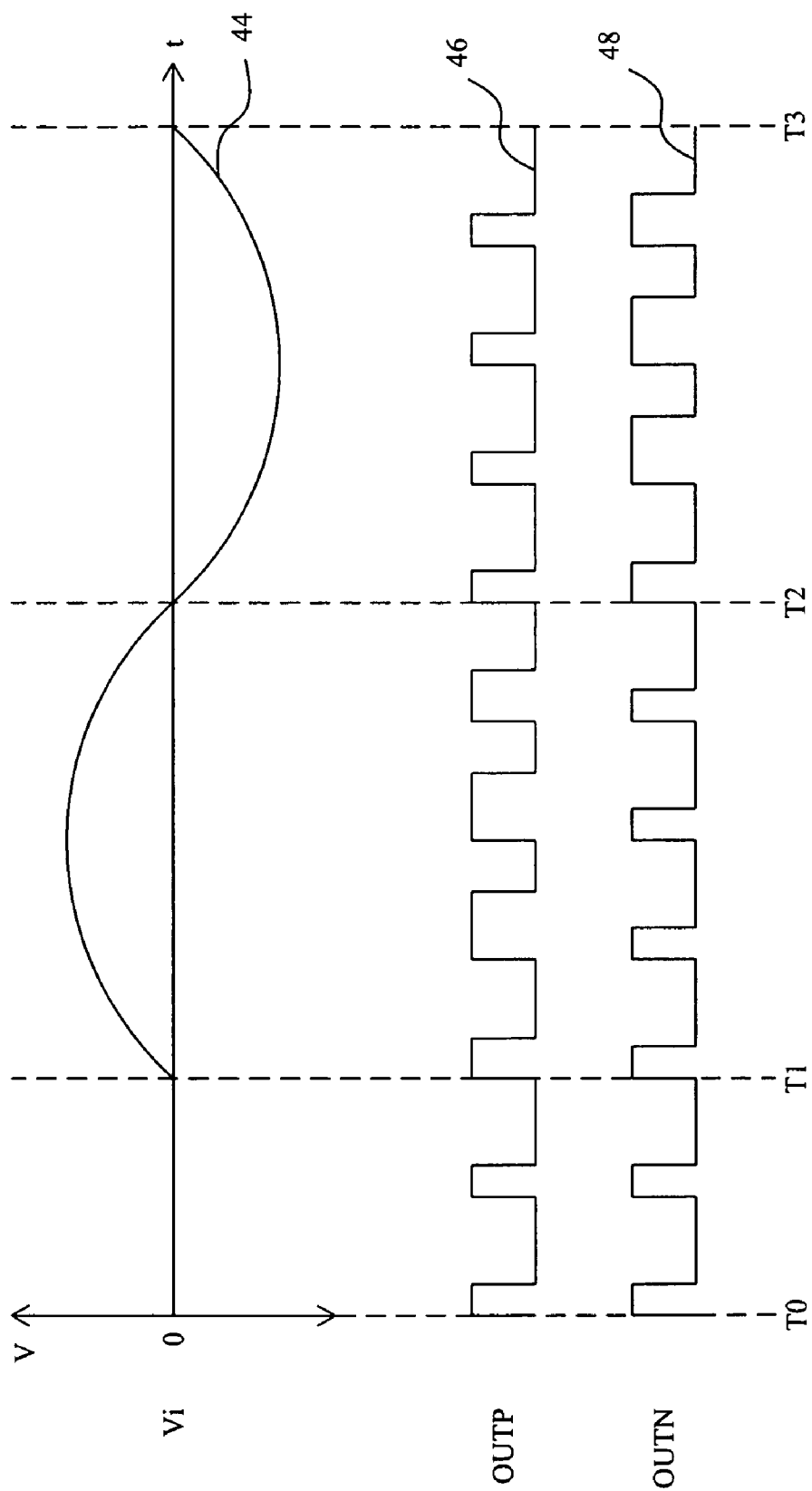
FIG. 4 is a timing diagram in one embodiment of the relationship between the input signal Vi and output signals OUTP and OUTN of the switching amplifier shown in FIG. 3.

FIG. 3 shows a filterless switching amplifier 30 according to the present invention, which includes an H-bridge circuit having a transistor 34 connected between a supply voltage Vcc and an output terminal OUTP, a transistor 36 connected between the output terminal OUTP and ground GND, a transistor 38 connected between the supply voltage Vcc and an output terminal OUTN, and a transistor 40 connected between the output terminal OUTN and ground GND, and a control circuit to switch the transistors 34, 36, 38 and 40 in response to an input signal Vi to thereby generate the output signals OUTP and OUTN for a load 42. FIG. 4 shows an embodiment of the relationship between the input signal Vi and the output signals OUTP and OUTN, in which waveform 44 represents the input signal Vi, waveform 46 represent the output signal OUTP, and waveform 48 represents the output signal OUTN. During the time interval from T0 to T1, the input signal Vi is zero, and the control circuit 32 switches the transistors 34, 36, 38 and 40 so that the output signals OUTP and OUTN have narrow pulse trains, i.e., the output signals OUTP and OUTN have very small duty cycles, as shown by the waveforms 46 and 48 respectively; during the time interval from T1 to T2, the input signal Vi is greater than zero, and the control circuit 32 switches the transistors 34, 36, 38 and 40 so that the duty cycle of the output signal OUTP varies with the input signal Vi, while the output signal OUTN still behaves as in the case when the input signal Vi is zero; and during the time interval from T2 to T3, the input signal Vi is less than zero, and the control circuit 32 switches the transistors 34, 36, 38 and 40 so that the output signal OUTP has the same waveform as in the case when the input signal Vi is zero, while the duty cycle of the output signal OUTN varies with the input signal Vi. In this embodiment, the term 'zero' for the comparison with the input signal Vi indicates a reference value, not necessarily the absolute zero, depending on the actual applications of the switching amplifier 30.

In the embodiment shown in FIG. 4, when the input signal Vi=0, the phase difference between the output signals OUTP and OUTN is zero degree, but in other embodiments, the phase difference between the output signals OUTP and OUTN may be 180 degrees or any other degrees, as shown in FIG. 5 and FIG. 6. In FIG. 5, the phase difference between the output signals OUTP and OUTN is ranged between 0 and 180 degrees, and in FIG. 6, the phase difference between the output signals OUTP and OUTN is 180 degrees.

Figure 1:
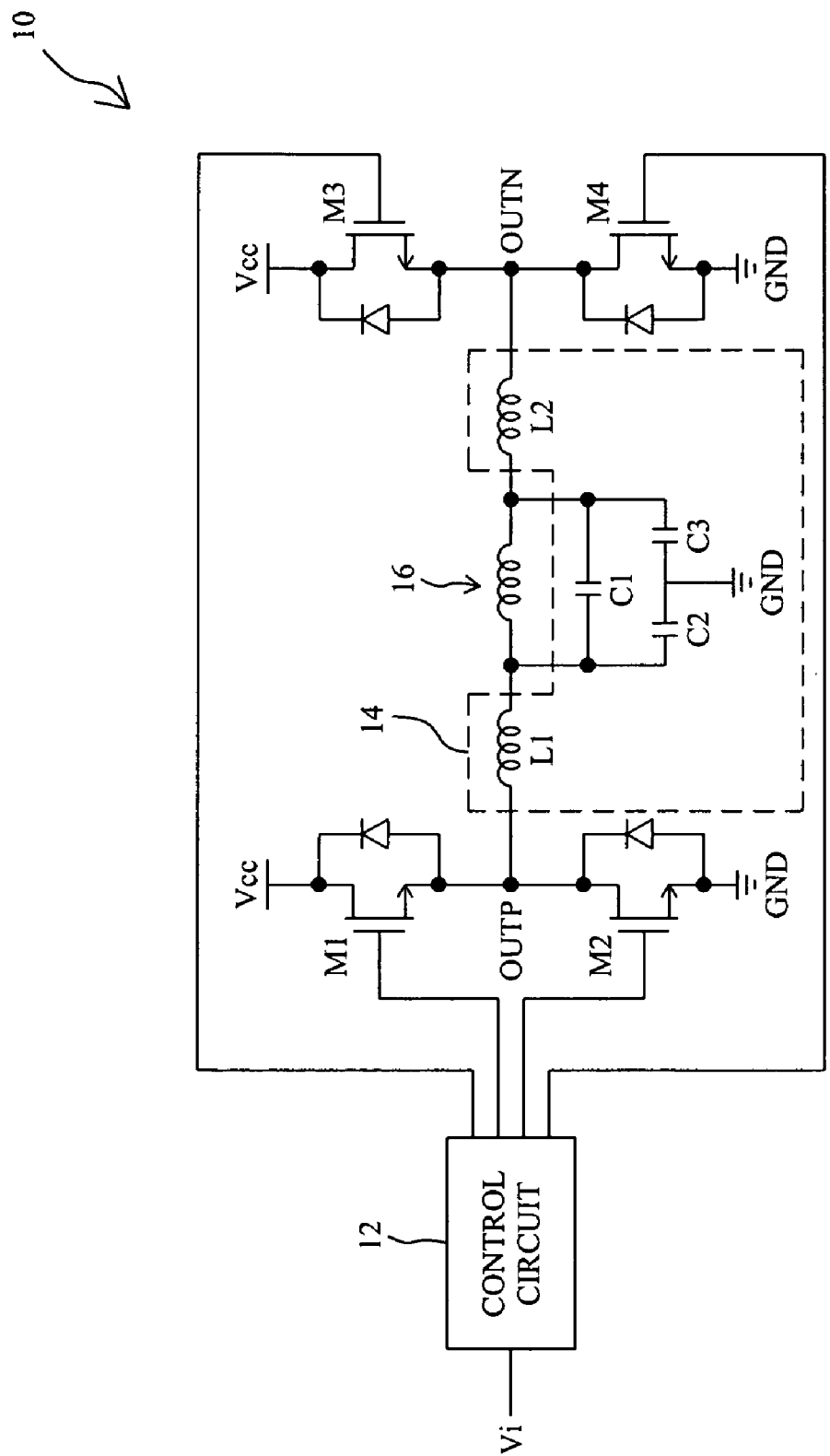
FIG. 1 is a schematic diagram of a conventional switching amplifier having a low-pass filter between its output terminals and load.
Figure 2:
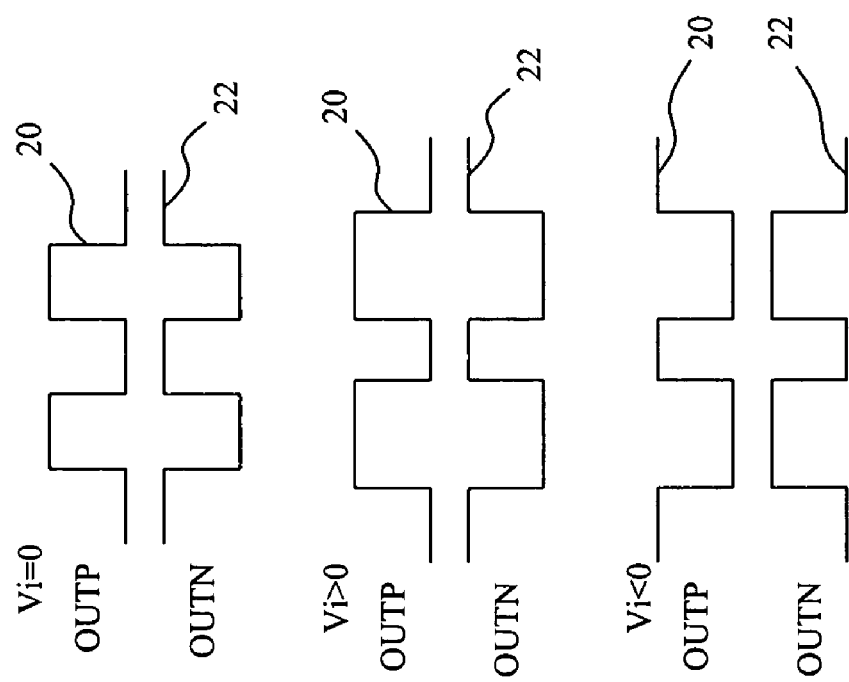
FIG. 2 shows waveforms of the output signals OUTP and OUTN of the switching amplifier shown in FIG. 1 at different input signals Vi's.

In the embodiments mentioned above, the description is based on a filterless switching amplifier, and in other embodiments, in order to further suppress EMI, a low-pass filter may be additionally included between the load and the output terminals OUTP and OUTN as that shown in FIG. 1.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A switching amplifier comprising:
an H-bridge circuit with a pair of output terminals; and
a control circuit for operating said H-bridge circuit in response to an input signal to thereby generate a first output signal on the first one of said pair of output terminals and a second output signal on the second one of said pair of output terminals;
wherein responsive to said input signal being equal to a reference value, said first output signal has a first duty cycle and said second output signal has a second duty cycle; responsive to said input signal being greater than said reference value, said first output signal has a third duty cycle varying with said input signal and said duty cycle of second output signal remains fixed at said second duty cycle; and responsive to said input signal being less than said reference value, said duty cycle of first output signal remains fixed at said first duty cycle and said second output signal has a fourth duty cycle varying with said input signal.

2. The switching amplifier of claim 1, wherein said first and second output signals have a phase difference therebetween.

3. The switching amplifier of claim 2, wherein said phase difference is 180 degrees.

4. The switching amplifier of claim 2, wherein said phase difference is between 0 and 180 degrees.

5. The switching amplifier of claim 1, wherein said first and second output signals are in phase.

6. The switching amplifier of claim 1, wherein said first and second output signals comprise square waves.

7. The switching amplifier of claim 1, wherein said first and second duty cycles have equal size.

8. The switching amplifier of claim 1, further comprising a filter connected to said pair of output terminals.

9. A control method for a switching amplifier, comprising the steps of:
driving an H-bridge circuit in response to an input signal for generating first and second output signals such that when said input signal is equal to a reference value, said first output signal has a first duty cycle and said second output signal has a second duty cycle;
when said input signal is greater than said reference value, said first output signal has a third duty cycle varying with said input signal and said duty cycle of said second output remains fixed at said second duty cycle; and
when said input signal is less than said reference value, said duty cycle of said first output remains fixed at said first duty cycle and said second output signal has a fourth duty cycle varying with said input signal.

10. The control method of claim 9, wherein said first and second output signals have a phase difference therebetween.

11. The control method of claim 10, wherein said phase difference is 180 degrees.

12. The control method of claim 10, wherein said phase difference is between 0 and 180 degrees.

13. The control method of claim 9, wherein said first and second output signals are in phase.

14. The control method of claim 9, wherein said first and second output signals have square waves.

15. The control method of claim 9, wherein said first and second duty cycles have equal size.

* * * * *